(12) United States Patent
Udagawa et al.

(10) Patent No.: US 6,194,744 B1
(45) Date of Patent: Feb. 27, 2001

(54) METHOD OF GROWING GROUP III NITRIDE SEMICONDUCTOR CRYSTAL LAYER AND SEMICONDUCTOR DEVICE INCORPORATING GROUP III NITRIDE SEMICONDUCTOR CRYSTAL LAYER

(75) Inventors: Takashi Udagawa, Chichibu; Kazutaka Terashima, Ebina; Suzuka Nishimura, Yamaguchi; Takuji Tsuzaki, Matsumoto, all of (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/500,450

(22) Filed: Feb. 9, 2000

Related U.S. Application Data

(62) Division of application No. 09/270,749, filed on Mar. 17, 1999, now Pat. No. 6,069,021.

(30) Foreign Application Priority Data

Mar. 17, 1998 (JP) .................................. 10-66769
Feb. 16, 1999 (JP) .................................. 11-36830

(51) Int. Cl.$^7$ ............................................... H01L 33/00
(52) U.S. Cl. ................................ 257/94; 372/43
(58) Field of Search .................................. 257/94; 372/43

(56) References Cited

U.S. PATENT DOCUMENTS 5,689,123 * 11/1997 Major et al. .......................... 257/190

FOREIGN PATENT DOCUMENTS 2-275682 11/1990 (JP) .............................. H01L/33/00
6-268259 9/1994 (JP) .............................. H01L/33/00

OTHER PUBLICATIONS

Electronics Letters, Nov. 6, 1997, vol. 33, No. 23, pp. 1986–1987, "GaN Based Light Emitting Diodes Grown on Si(111) by Molecular Beam Epitaxy", Guha, S. et al.

* cited by examiner

*Primary Examiner*—Olik Chaudhuri
*Assistant Examiner*—Douglas A. Wille
(74) *Attorney, Agent, or Firm*—Sughrue, Mion, Zinn, Macpeak & Seas, PLLC

(57) ABSTRACT

A method of growing a group III nitride semiconductor crystal layer includes a step of growing a first buffer layer composed of boron phosphide on a silicon single crystal substrate by a vapor phase growth method at a temperature of not lower than 200° C. and not higher than 700° C., a step of growing a second buffer layer composed of boron phosphide on the first buffer layer by a vapor phase growth method at a temperature of not lower than 750° C. and not higher than 1200° C., and a step of growing a crystal layer composed of group III nitride semiconductor crystal represented by general formula $Al_pGa_qIn_rN$ (where $0 \leq p \leq 1$, $0 \leq q \leq 1$, $0 \leq r \leq 1$, $p+q+r=1$) on the second buffer layer by a vapor phase growth method. A semiconductor device incorporating the group III nitride semiconductor crystal layer is provided.

6 Claims, 3 Drawing Sheets

METHOD OF GROWING GROUP III NITRIDE SEMICONDUCTOR CRYSTAL LAYER AND SEMICONDUCTOR DEVICE INCORPORATING GROUP III NITRIDE SEMICONDUCTOR CRYSTAL LAYER

CROSS REFERENCE TO RELATED APPLICATIONS

This is a divisional of application Ser. No. 09/270,749 filed Mar. 17, 1999, now U.S. Pat. No. 6,069,021 the disclosure of which is incorporated herein by reference.

BACKGROUND OF THE INVENTION

1. Field of the Invention

This invention relates to a method of growing group III nitride semiconductor crystal layer for forming a high-quality group III nitride semiconductor crystal layer on a silicon (Si) single crystal substrate by a vapor phase growth method and to a semiconductor device incorporating a group III nitride semiconductor crystal layer formed by the growth method.

2. Description of the Prior Art

Vapor phase growth methods have heretofore been used to grow crystal layers consisting of group III nitride semiconductor represented by the general formula $Al_pGa_qIn_rN$ (where $0 \leq p \leq 1$, $0 \leq q \leq 1$, $0 \leq r \leq 1$, p+q+r=1) on sapphire ($Al_2O_3$ single crystal) substrate via a buffer layer also consisting of group III nitride semiconductor. In addition, light-emitting diodes (LEDs), laser diodes (LDs) and other such semiconductor devices have been fabricated using group III nitride semiconductor crystal layers formed on sapphire substrates.

Japanese Patent Public Disclosure 6-268259, for example, teaches an LED fabricated using group III nitride semiconductor crystal layers formed on a sapphire substrate. FIG. 3 shows an example configuration of an LED fabricated using a group III nitride semiconductor crystal layer formed on a sapphire substrate 201.

In FIG. 3, 202 designates a buffer layer composed of gallium nitride (GaN), 203 an n-type GaN layer, 204 an n-type clad layer composed of n-type $Ga_{0.86}Al_{0.14}N$, 205 a light-emitting layer composed of n-type $In_{0.01}Ga_{0.99}N$, 206 a p-type clad layer composed of p-type $Ga_{0.86}Al_{0.14}N$, 207 a contact layer composed of p-type GaN, 208 a p-type electrode, and 209 an n-type electrode.

The practice has thus been to form group III nitride semiconductor crystal layers, such as the n-type clad layer 204 composed of n-type $Ga_{0.86}Al_{0.14}N$ and the light-emitting layer 205 composed of n-type $In_{0.01}Ga_{0.99}N$ on the sapphire substrate 201 with, for example, the buffer layer 202 disposed therebetween. The n-type electrode 209 is formed by removing a portion of the layers 203–207 composed of group III nitride semiconductor crystal downward from the surface.

Thus, in the fabrication of LEDs using group III nitride semiconductor crystal layers formed on a sapphire substrate, the fact that the substrate is an electrical insulator has made it necessary to provide at least one of the electrodes by removing a portion of the group III nitride semiconductor crystal layers deposited on the substrate. This complicates processing and lowers product yield.

Moreover, sapphire is hard and poor in cleavage property. When semiconductor devices are fabricated using sapphire, therefore, the work of separating the substrate overlaid with the group III nitride semiconductor crystal layers into square devices is troublesome. A particular disadvantage encountered in the fabrication of LEDs using group III nitride semiconductor crystal layers formed on a sapphire substrate is that flat and smooth optical resonance facet cannot be formed at both ends of the device by utilizing cleavage surfaces.

Silicon (Si) single crystal has cubic system diamond structure.

The ability to form group III nitride semiconductor crystal layers on a substrate of silicon single crystal would simplify the work of separation into the individual square devices because it would make it possible to utilize the cleavage property of the silicon single crystal in the (011) directions for cutting the substrate overlaid with the group III nitride semiconductor crystal layers. Utilization of cleavage surfaces to form smooth optical resonance facet would also be possible in the fabrication of LDs.

Moreover, use of conductive silicon single crystal as the substrate would permit formation of an electrode on the opposite substrate surface from that on which the group III nitride semiconductor crystal layers are formed, thereby eliminating the need to effect processing for removal of a portion of the group III nitride semiconductor crystal layers at the time of electrode formation.

These considerations have led to research into technologies for forming group III nitride semiconductor crystal layers on silicon single crystal substrates by a vapor phase growth method.

A major obstacle to progress has been the lattice mismatch between silicon single crystal and group III nitride semiconductor crystal owing to the difference between their lattice constants. For example, the lattice constant of silicon single crystal is 5.431 Å while the lattice constants of cubic system gallium nitride (GaN), aluminum nitride (AlN) and indium nitride (InN) are 4.51 Å, 4.38 Å and 4.98 Å, respectively. Based on the lattice constant of silicon single crystal, therefore, the lattice constants of GaN, AlN and InN differ therefrom by 8–19%. This has prevented the formation of a high-quality group III nitride semiconductor crystal layer by direct growth on a silicon single crystal substrate.

Development of technologies for growing group III nitride semiconductor crystal layers on silicon single crystal substrates have therefore focused on insertion of an appropriate buffer layer between the silicon single crystal substrate and the group III nitride semiconductor crystal layer.

Electron. Lett., 33(23) (1997), pp1986–1987, for instance, describes a blue LED obtained by forming a buffer layer composed of aluminum nitride (AlN) on an n-type silicon single crystal substrate doped with antimony (Sb) and then forming a group III nitride semiconductor crystal layer on the buffer layer. The buffer layer composed of AlN and the group III nitride semiconductor crystal layer deposited thereon were formed by the molecular beam epitaxy (MBE) method.

On the other hand, Japanese Patent Public Disclosure 2-275682 teaches a technology for growing a group III nitride semiconductor crystal layer on a gallium phosphide (GaP) substrate or a silicon carbide (SiC) substrate via an interposed buffer layer of boron phosphide (BP), and says that the method is also usable in the case of utilizing a silicon single crystal substrate.

The lattice constant of BP with a zinc-blende-type crystal structure is 4.538 Å. This is only slightly (about 0.6%) different from the 4.51 Å lattice constant of cubic GaN. Thus, if a buffer layer consisting of flat and continuous BP can be formed on a silicon single crystal substrate, it should be easy to form a group III nitride semiconductor crystal layer with excellent crystallinity thereon.

Japanese Patent Public Disclosure 2-275682 attempts to utilize this principle by forming a buffer layer composed of BP and a group III nitride semiconductor crystal layer, both by the MOCVD method, at a temperature in the range 850–1150° C. or 1200–1400° C. Another generally known vapor phase growth method for crystal layers composed of BP is the halide vapor phase growth method.

However, the lattice constant of silicon crystal and BP crystal are 5.431 Å and 4.538 Å, which amounts to a lattice constant difference of 16.5% between the two. Therefore, in actual practice, when the BP crystal layer is directly grown on the silicon single crystal substrate at a high temperature of 850° C. or higher, the formed BP crystal does not become a flat and continuous layer but instead takes the form of scattered pyramid-like islands on the silicon single crystal substrate surface.

In other words, the conventional technology of using a vapor phase growth method to grow BP crystal directly on a silicon single crystal substrate at a high temperature of 850° C. or higher and then growing a group III nitride semiconductor crystal layer thereon is incapable of forming a buffer layer consisting of flat and continuous BP. This makes it impossible to grow a continuous group III nitride semiconductor crystal layer of good quality on the buffer layer.

Moreover, when BP crystal is grown on the surface of a silicon crystal substrate by this conventional method, the difference between the lattice constants of the two crystals makes the BP crystal highly susceptible to peeling.

One object of the present invention is therefore to provide a method of growing a group III nitride semiconductor crystal layer which, by defining the conditions for forming a buffer layer composed of flat and continuous BP on a silicon single crystal substrate by a vapor phase growth method, enables formation of a high-quality group III nitride semiconductor crystal layer on a silicon single crystal substrate.

Another object of the present invention is to provide a high-performance, easy-to-fabricate semiconductor device, e.g. an LED, utilizing a group III nitride semiconductor crystal layer formed by the growth method according to the invention.

SUMMARY OF THE INVENTION

To achieve the foregoing objects, the present invention provides a method of growing a group III nitride semiconductor crystal layer comprising a step of growing a first buffer layer composed of boron phosphide (composition formula: BP) on a silicon (Si) single crystal substrate by a vapor phase growth method at a temperature of not lower than 200° C. and not higher than 700° C., a step of growing a second buffer layer composed of boron phosphide on the first buffer layer by a vapor phase growth method at a temperature of not lower than 750° C. and not higher than 1200° C., and a step of growing a crystal layer composed of group III nitride semiconductor crystal represented by general formula $Al_pGa_qIn_rN$ (where $0 \leq p \leq 1$, $0 \leq q \leq 1$, $0 \leq r \leq 1$, $p+q+r=1$) on the second buffer layer by a vapor phase growth method.

The foregoing method of growing a semiconductor crystal layer can further comprise a step conducted after growth of the second buffer layer of, in an atmosphere containing ammonia ($NH_3$) or a hydrazine ($N_2H_4$), nitriding a portion of the boron phosphide at a surface of the second buffer layer or forming on the second buffer layer a buffer layer composed of boron phosphide containing nitrogen, the step of growing the group III nitride semiconductor crystal layer being effected on the second buffer layer thereafter.

In the foregoing method of growing a semiconductor crystal layer, the step of growing a group III nitride semiconductor crystal layer can be a step of growing a group III nitride semiconductor crystal layer composed of gallium nitride (GaN) in contact with the second buffer layer.

In the foregoing method of growing a semiconductor crystal layer, the temperature at which the first buffer layer is grown is preferably not lower than 250° C. and not higher than 550° C. The temperature at which the second buffer layer is grown is preferably not lower than 850° C. and not higher than 1050° C.

In the foregoing method of growing a semiconductor crystal layer, the vapor phase growth method for the first buffer layer and the second buffer layer is preferably the halide vapor phase growth method and the vapor phase growth method for the group III nitride semiconductor crystal layer is preferably the metalorganic chemical vapor deposition method. Otherwise, the vapor phase growth method for the first buffer layer and the second buffer layer and the vapor phase growth method for the group III nitride semiconductor crystal layer are both preferably the metalorganic chemical vapor deposition method.

The present invention further provides a semiconductor device incorporating a group III nitride semiconductor crystal layer comprising a silicon single crystal substrate, a first buffer layer composed of polycrystalline boron phosphide provided on the substrate, a second buffer layer composed of a single crystal layer of boron phosphide provided on the first buffer layer and a group III nitride semiconductor crystal layer provided on the second buffer layer.

The foregoing semiconductor device can further comprise a single crystal layer composed of boron phosphide containing nitrogen interposed between the second buffer layer and the group III nitride semiconductor crystal layer provided thereon.

In the foregoing semiconductor device, the group III nitride semiconductor crystal layer provided on the second buffer layer can be composed of gallium nitride.

In the foregoing semiconductor device, the first buffer layer can have a thickness of between 2 nm and 2 μm.

When vapor phase growth is effected on the single crystal substrate at a temperature in the range of 200° C.–700° C. as described in the foregoing, a first buffer layer composed of polycrystalline or amorphous BP is formed which relieves strain arising relative to the single crystal substrate owing to difference between lattice constants. Then when vapor phase growth is effected on the first buffer layer at a temperature in the range of 750° C.–1200° C., a single crystal second buffer layer is continuously formed. A crystal layer composed of high-quality group III nitride semiconductor is formed on the second buffer layer.

The above and other features of the present invention will become apparent from the following description made with reference to the drawings.

DESCRIPTION OF THE PREFERRED EMBODIMENTS

Focusing on use of a vapor phase growth method to grow a group III nitride semiconductor crystal layer on a Si single crystal substrate via an interposed buffer layer composed of BP, the inventors discovered that a flat and continuous buffer layer composed of BP can advantageously be formed by the method of first growing a buffer layer composed of polycrystalline or amorphous BP at a low temperature and then growing a second buffer layer composed of single crystal BP on the first buffer layer at a high temperature.

Figure 1:
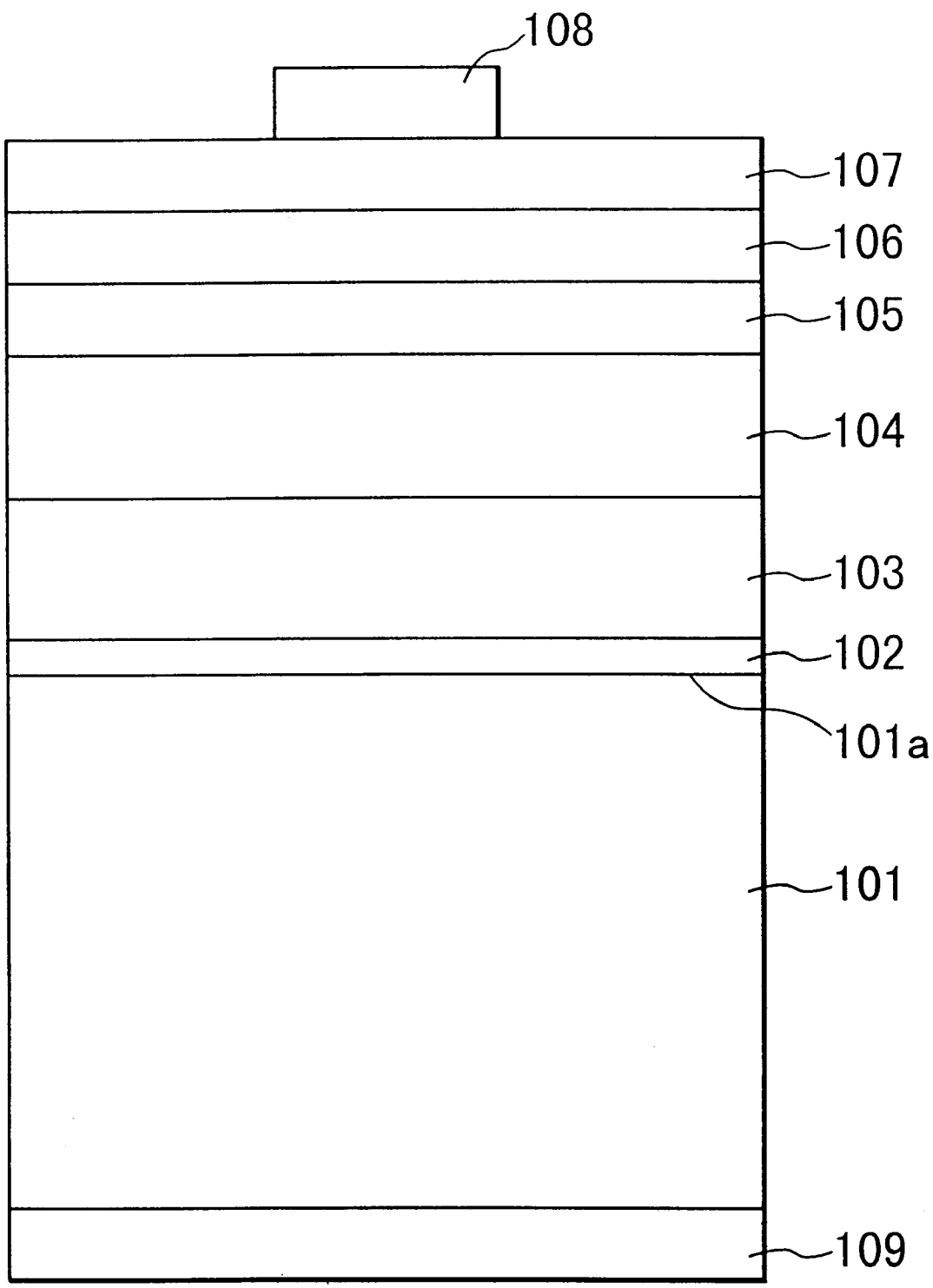
FIG. 1 is a sectional view showing a semiconductor device incorporating a group III nitride semiconductor crystal layer, that is an embodiment of the invention.

FIG. 1 shows a semiconductor device that is a preferred embodiment of the invention. As shown, the semiconductor device comprises a Si single crystal substrate 101 having a first buffer layer 102 composed of polycrystalline or amorphous BP grown thereon by a vapor phase growth method. The growth is preferably effected at a temperature not lower than 200° C. and not higher than 700° C., more preferably not lower than 250° C. and not higher than 550° C.

In the as-grown state, the first buffer layer composed of BP deposited on the Si single crystal substrate at a temperature not lower than 200° C. and not higher than 700° C., more preferably not lower than 250° C. and not higher than 550° C., is polycrystalline or amorphous. By observation using a transmission electron microscope (TEM), the inventors ascertained that the region of the first buffer layer 102 in the vicinity of its junction interface 101a with the Si single crystal substrate is mainly polycrystalline and the region upward thereof is mainly amorphous.

As the first buffer layer thus consists of polycrystal and/or amorphous regions, in can of its own buffer crystal strain owing to the different lattice constants between BP and Si crystal. It can therefore be evenly formed on the Si single crystal substrate.

Moreover, when BP crystal is grown at a high temperature on the first buffer layer 102, a BP single crystal layer can be formed to constitute a flat and continuous second buffer layer 103. The reason for this is thought to be that the upper portion of the first buffer layer is amorphous and pliant owing to the weak bonding between its constituent atoms and therefore relieves the strain tending to arise between the Si single crystal substrate and second buffer layer composed of single crystal BP owing to the difference between their lattice constants.

The strain buffering effect that the first buffer layer provides between the Si single crystal substrate and the second buffer layer also prevents the second buffer layer from peeling off the Si single crystal substrate.

In contrast, BP crystal directly grown on a Si single crystal substrate at a temperature exceeding 700° C. becomes a discontinuous layer of pyramid-like BP crystal islands scattered over the silicon single crystal substrate surface. A BP layer formed at higher than 700° C. is therefore not effective as a buffer layer.

Moreover, when the growth temperature of the first buffer layer is set to 550° C. or lower, a flat and continuous second buffer layer can be formed evenly and with good reproducibility over the entire substrate surface. The reason for this is still not well understood but is thought to be that growing the first buffer layer at a temperature of 550° C. or lower reduces variance in the polycrystalline or amorphous state within the first buffer layer.

No layer composed of polycrystalline or amorphous BP forms on the Si single crystal substrate when the first buffer layer growth temperature is lower than 200° C. This is probably because at a low temperature below 200° C. reaction of the source materials does not proceed sufficiently to enable a BP layer to form by vapor phase growth.

In contrast, setting the growth temperature of the first buffer layer to 200° C. or higher, preferably to 250° C. or higher, enables growth of a single crystal or amorphous first buffer layer with good stability.

The thickness of the first buffer layer is preferably in the range of 2 nm to 2 $\mu$m.

When the first buffer layer has a thickness of less than 2 nm, it cannot sufficiently and evenly cover the whole surface of the Si single crystal substrate owing to variance in the thickness thereof.

When the first buffer layer has a thickness exceeding 2 $\mu$m, its surface condition is spoiled by bumps and the like. This makes it impossible to obtain a flat second buffer layer.

A first buffer layer of a thickness exceeding 20 nm experiences degraded current flow by the tunnel effect and is therefore preferably doped with an appropriate impurity for controlling its conductivity type. For instance, an n-type layer can be obtained by doping a first buffer layer composed of BP with Si, while a p-type first buffer layer can be obtained by doping it with a group II element such as magnesium (Mg).

The inventors found by TEM observation that the first buffer layer becomes polycrystalline after the second buffer layer is formed thereon a high temperature. This it thought to be because the exposure of the first buffer layer to high temperature in the second buffer layer forming step converts it from an amorphous to a polycrystalline state.

The second buffer layer formed of BP single crystal is deposited on the first buffer layer by a vapor phase growth method at a temperature of not lower than 750° C. and not higher than 1200° C. A continuous and flat second buffer layer can be grown on the first buffer layer grown at a low temperature in the foregoing manner.

The thickness of the second buffer layer is preferably in the range of 0.5–5 $\mu$m. The carrier concentration of the second buffer layer is preferably $1\times10^{17}$–$1\times10^{19}$cm$^{-3}$.

When the second buffer layer composed of BP is grown at a temperature exceeding 1200° C., some of the BP crystal may transform to boron phosphide polyhedron having a composition formula such as $B_{13}P_2$. $B_{13}P_2$ is a hexagonal crystal of rhombohedral structure and differs in lattice constant from cubic BP crystal grown at 1200° C. or lower. When the second buffer layer is grown at a temperature exceeding 1200° C., it tends to have crystals composed of boron phosphide polyhedron dispersed throughout as large inclusions within the BP single crystal layer. These act as nuclei for the development of hillocks that degrade the flatness of the second buffer layer surface.

The second buffer layer is therefore preferably grown at a temperature not higher than 1200° C. A second buffer layer growth temperature of not higher than 1050° C. is particularly advantageous since it enables growth of a continuous and flat second buffer layer with good reproducibility.

A second buffer layer consisting of a uniform single crystal layer cannot be obtained at a growth temperature of below 750° C. When grown at a temperature below this level, it tends to locally include polycrystalline or amorphous BP. The reason for this is assumed to be that the amount of energy available for BP crystallization is insufficient during low-temperature growth.

The second buffer layer growth temperature is therefore preferably made not lower than 750° C., more preferably not lower than 850° C.

The first and second buffer layers composed of BP can be formed by various vapor phase growth methods including the halide vapor phase epitaxy (VPE) method, the hydride vapor phase epitaxy (VPE) method, and the metalorganic chemical vapor deposition (MOCVD) method.

Among these, the halide VPE method can utilize a chemical product refined to high purity, such as boron trichloride ($BCl_3$) or phosphorous trichloride ($PCl_3$), and can therefore produce buffer layers of excellent purity. The method is particularly advantageous in the point of enabling formation of high-purity BP crystal layers with low carbon impurity content. Another advantage of using the halide VPE method to grow the first buffer layer and the second buffer layer is that the first and second buffer layers can be successively formed in the same reaction apparatus.

The MOCVD method can grow a uniformly thin film over a region of large area. Use of the MOCVD method to grow the first and second buffer layers composed of BP is therefore advantageous in the point that it enables formation of buffer layers with uniform thickness on the Si single crystal substrate. It also permits the first and second buffer layers to be successively formed in the same reaction apparatus.

As boron source materials, the MOCVD method can use, for example, trimethylboron (($CH_3)_3B$), triethylboron (($C_2H_5)_3B$) and other organic boron compounds, borane ($BH_3$) diborane ($B_2H_6$) and other boron hydrides. Phosphine ($PH_3$) or the like can be used as the phosphorous source material.

A crystal layer composed of group III nitride semiconductor represented by the general formula $Al_pGa_qIn_rN$ (where $0 \leq p \leq 1$, $0 \leq q \leq 1$, $0 \leq r \leq 1$, $p+q+r=1$) is grown by a vapor phase growth method on the second buffer layer formed as described above. By this there can be formed a group III nitride semiconductor crystal layer of excellent quality.

A portion of the boron phosphide at the surface of the second buffer layer can be nitrided before the crystal layer composed of group III nitride semiconductor is deposited on the second buffer layer. This enables growth of a group III nitride semiconductor crystal layer of even better crystallinity.

The nitriding of BP at the surface of the second buffer layer can be effected by subjecting the Si single crystal substrate having the second buffer layer grown thereon in the foregoing manner to heat treatment in an atmosphere containing a nitrogen compound. A particularly preferable method is to introduce nitrogen into the crystal through the surface of the second buffer layer by retention in an atmosphere containing ammonia ($NH_3$) or hydrazines at a temperature not lower than 700° C. and not higher than 1200° C. By "hydrazines" is meant hydrazine or a hydrazine derivative such as dimethylhydrazine(($CH_3)_2N_2H_2$).

Nitriding of BP at the surface of the second buffer layer is most preferably conducted at a temperature of not greater than 1050° C. in order to avoid transformation of the BP constituting the second buffer layer to a polyhedron such as $B_{13}P_2$ during the nitriding treatment. Dimethylhydrazine is particularly preferable when conducting the nitriding treatment at 1050° C. or lower because it releases nitrogen at a lower temperature than ammonia.

When BP at the surface of the second buffer layer is nitrided, BP containing nitrogen (N) is formed in the region near the surface of the second buffer layer. The composition of the BP containing nitrogen can be represented by $BP_{1-x}N_x$ ($0<X<1$). Based on this, the composition is designated in the following in terms of the nitrogen content X.

The purpose of nitriding the BP at the surface of the second buffer layer is to make the lattice constants of the second buffer layer and the group III nitride semiconductor crystal layer formed thereon the same at the interface between the two. Specifically, the lattice constants at the interface between the two can be made the same by making X of the BP composition at the surface of the second buffer layer fall in the range of not less than 0.03 and not greater than 0.17 and forming the group III nitride semiconductor crystal layer of cubic crystal of $Al_bGa_{1-b}N$ ($0 \leq b \leq 1$). In particular, when X of the BP composition at the surface of the second buffer layer is made 0.03, the lattice constant at the surface of the second buffer layer becomes the same as that of cubic zinc-blende-type GaN.

By matching the lattice constants of the second buffer layer and the group III nitride semiconductor grown thereon, the group III nitride semiconductor crystal layer can be formed of excellent crystal having a low concentration of misfit dislocations and other crystal defects. A high-performance LED or other semiconductor device can be fabricated using a group III nitride semiconductor crystal layer with these qualities.

A sufficient thickness of the nitrided region near the surface of the second buffer layer is around 10 nm or so. The thickness of the nitrided region increases with increasing temperature and increasing length of the nitriding treatment. However, a nitriding treatment that produces a nitride region exceeding several $\mu$m in thickness degrades the flatness of the surface of the second buffer layer and this in turn degrades the crystallinity of the group III nitride semiconductor crystal layer grown thereon.

The thickness of the nitrided region can be determined from the depthwise distribution of the nitrogen atoms observed by, for instance, secondary ion-mass spectrometry (SIMS) or Auger electron spectrometry (AES).

A second buffer layer containing nitrogen in the surface region can also be formed by adding a nitrogen source material during growth of the layer. When the second buffer layer is grown by the halide VPE method using boron trichloride and phosphorous trichloride, for example, it can be formed to include nitrogen in the vicinity of its surface by adding dimethylhydrazine at the final growth stage.

While growth of the crystal layer composed of group III nitride semiconductor on the second buffer layer can be conducted after the BP at the surface of the second buffer layer has been nitrided as explained above, it is also possible to conduct the growth after a buffer layer composed of boron phosphide containing nitrogen has been grown on the second buffer layer.

Figure 2:
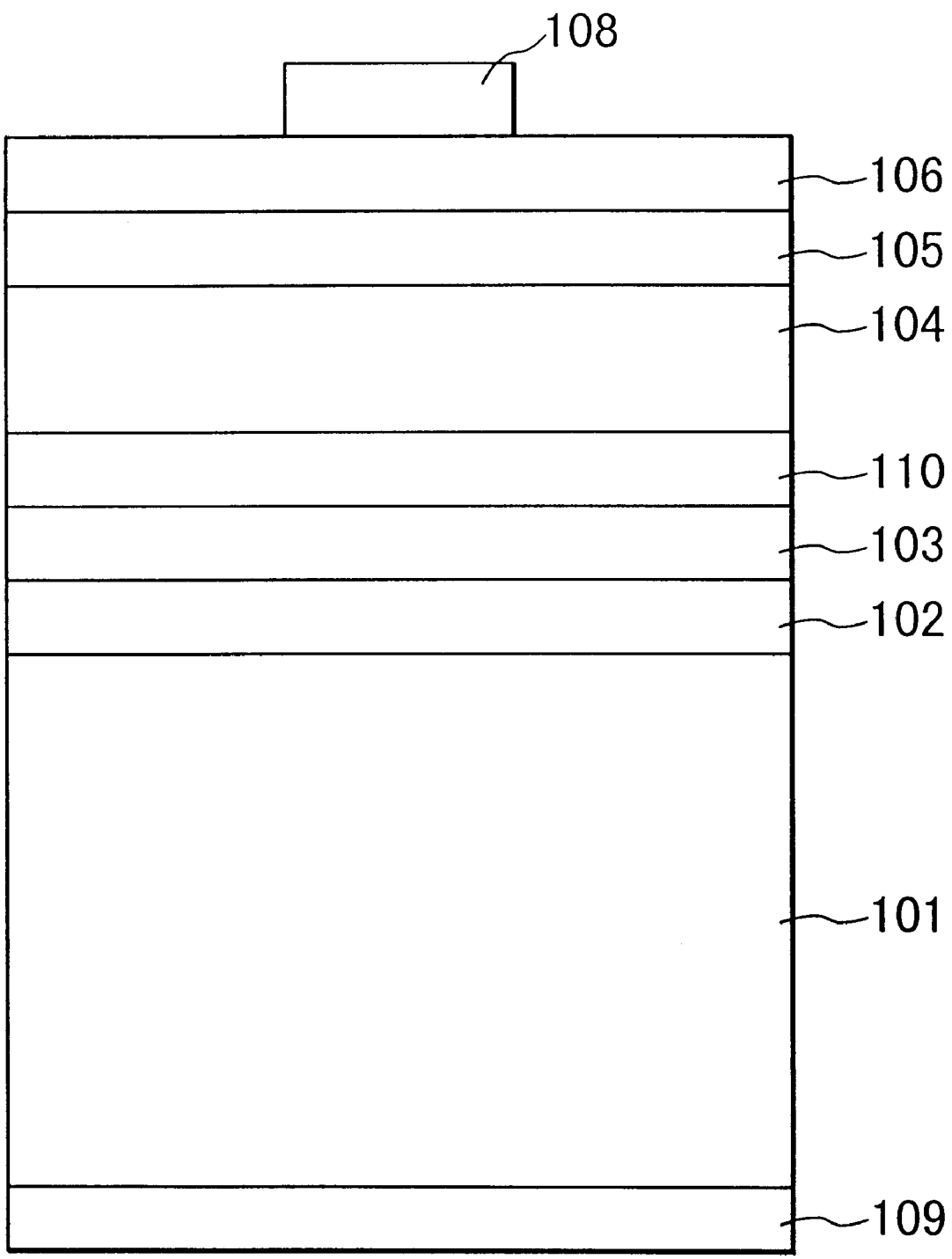
FIG. 2 is a sectional view showing a semiconductor device that is another embodiment of the invention.
Figure 3:
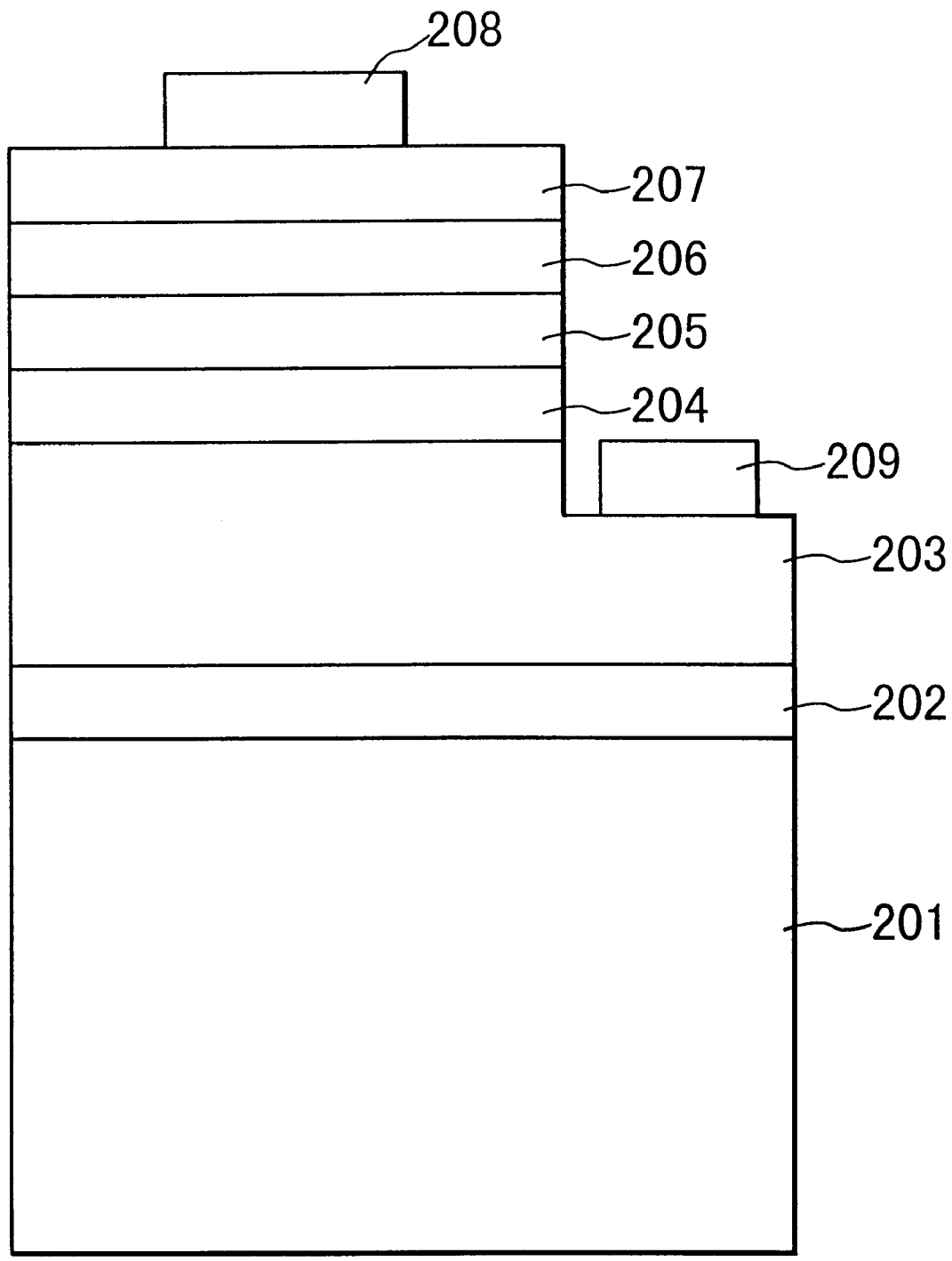
FIG. 3 is a sectional view of an LED utilizing a conventional group III nitride semiconductor crystal layer.

In this case, as shown in FIG. 2, a vapor phase growth method is used to grow buffer layers 102, 103 composed solely of boron phosphide on the silicon single crystal substrate, is then used to grow a buffer layer 110 composed of boron phosphide containing nitrogen on the buffer layers composed solely of boron phosphide, and is thereafter used to grow on the buffer layer 110 (composed of boron phosphide containing nitrogen) crystal layers 104, 105 and 106 composed of group III nitride semiconductor represented by the general formula $Al_pGa_qIn_rN$ (where $0 \leq p \leq 1$, $0 \leq q \leq 1$, $0 \leq r \leq 1$, $p+q+r=1$). The thickness of the buffer layer 110 composed of boron phosphide containing nitrogen is preferably in the range of 10 nm to a few $\mu$m.

The buffer layers composed solely of boron phosphide are preferably formed as a first buffer layer 102 composed of BP grown at a temperature not lower than 200° C. and not higher than 700° C. and a second buffer layer 103 composed of BP grown at a temperature of not lower than 750° C. and not higher than 1200° C. The buffer layer composed of boron phosphide containing nitrogen grown by a vapor phase growth method on the buffer layers composed solely of boron phosphide plays substantially the same role as that of the aforesaid nitrided region in the vicinity of the second buffer layer surface.

In this specification, the group III nitride semiconductor containing a small amount of phosphorous (P) or arsenic (As) as a group V element in addition to nitrogen can be utilized equivalently to $Al_pGa_qIn_rN$ (where $0 \leq p \leq 1$, $0 \leq q \leq 1$, $0 \leq r \leq 1$, p+q+r=1).

The crystal layer composed of group III nitride semiconductor grown on the second buffer layer can be grown by the halide VPE method, the hydride VPE method or the molecular beam epitaxy method.

Growth of the group III nitride semiconductor crystal layer by the halide VPE method at a temperature higher than around 1000° C. is, however, disadvantageous because halides generated by thermal decomposition of the chloride or fluoride source material in this method produce a corrosive/erosive action that makes it impossible to obtain a group III nitride semiconductor crystal layer with excellent flatness. Moreover, the method cannot be used to grow a group III nitride semiconductor crystal layer containing Al (e.g., AlGaN) because no Al halide with suitable vapor pressure for growth is available.

The hydride VPE method is a vapor phase growth method that uses III group metal and hydride of a V group element as source materials. However, it is also incapable of growing a group III nitride semiconductor crystal layer containing Al owing to the unavailability of an Al source material with vapor pressure suitable for growth.

The MBE method effects growth in a high-vacuum, high-temperature environment that tends to cause loss of the group III nitride semiconductor crystal layer by sublimation.

In contrast, MOCVD is a highly suitable method for growing a group III nitride semiconductor crystal layer.

Source materials usable for growing group III nitride semiconductor crystal layers by the MOCVD method include trialkyl compounds of group III elements and hydrides of group V elements. As an atmosphere containing a phosphorous source material such as phosphine ($PH_3$) is easy to establish in the MOCVD method, degradation of the smoothness of the surface of the second buffer layer composed of BP can be prevented during growth under a high-temperature environment.

Since the MOCVD method can grow a crystal layer even under atmospheric pressure or only slight pressurization, it minimizes sublimation loss of GaN and still more readily sublimated GaInN mixed crystal, and thus enables formation of a continuous group III nitride semiconductor crystal layer on the second buffer layer.

When a group III nitride semiconductor crystal layer is grown by the reduced-pressure MOCVD method, the aluminum source materials such as trialkyl aluminum (($CH_3$)$_3$Al) and nitrogen source materials such as ammonia are thermally decomposed with enhanced efficiency. The method is therefore superior to the atmospheric-pressure MOCVD method in enabling growth of the group III nitride semiconductor crystal layer at low temperature. Growth at low temperature further suppresses loss by sublimation and facilitates growth of a group III nitride semiconductor layer with good continuity. The MOCVD method using hydrazines as the nitrogen source material is particularly noteworthy because, owing to the ready decomposability of hydrazines, it enables growth of the group III nitride semiconductor crystal layer at a temperature in the same general range as that used for growing the second buffer layer. This is advantageous because it allows the group III nitride semiconductor crystal layer to be grown on the second buffer layer with no change in the temperature of the substrate.

When the group III nitride semiconductor crystal layer is grown using the MOCVD method, doping of the group III nitride semiconductor with magnesium, the typical p-type impurity used with this type of semiconductor, is simply achieved. An Mg-doped group III nitride semiconductor crystal layer can therefore be obtained more easily than when using the halide VPE method or the hydride VPE method.

A high-performance LED or other semiconductor device can be fabricated using a group III nitride semiconductor crystal layer formed in the foregoing manner. For instance, an epitaxial wafer for manufacturing LEDs can be fabricated by successively depositing on the second buffer layer a first clad layer consisting of a first-conductivity-type group III nitride semiconductor crystal layer, a light-emitting layer consisting of a group III nitride semiconductor crystal layer and a second clad layer consisting of a second-conductivity-type group III nitride semiconductor crystal layer, thereby constituting a double heterostructure light-emitting portion. The first clad layer or the second clad layer can be fabricated of AlGaN. The light-emitting layer can be fabricated of GaInN.

As explained in the foregoing, in the method according to the present invention, the group III nitride semiconductor crystal layers formed on the Si single crystal substrate via the interposed first and second buffer layers composed of BP, e.g., the first and second clad layers formed of AlGaN and the light-emitting layer composed of GaInN, are high-quality layers with superb crystallinity. LEDs fabricated from the wafer therefore exhibit high emission power output and excellent emission characteristics.

Since the epitaxial wafer fabricated in the foregoing manner uses a Si single crystal substrate, the processing for cutting the epitaxial wafer into individual square devices can be easily conducted utilizing the cleavage property of the Si single crystal. In addition, owing to the epitaxial wafer's use of the conductive Si single crystal as its substrate, an electrode can be formed on the opposite substrate surface from that on which the group III nitride semiconductor crystal layers are formed, thereby eliminating the need to effect processing for removal of a portion of the group III nitride semiconductor crystal layers at the time of forming the LED electrodes.

In short, an LED or other semiconductor device can be readily fabricated by use of the group III nitride semiconductor crystal layer formed by the growth method according to the present invention.

The invention will now be explained with respect to specific working examples.

EXAMPLE 1

LEDs of the configuration shown in FIG. 1 were fabricated by the method of the present invention. The fabrication steps employed are set out in the following.

The substrate 101 used was an n-type Si single crystal doped with phosphorous (P) having a (001) 2° off surface.

The buffer layers were grown by the halide VPE method.

Before growth of the first buffer layer 102, the substrate 101 placed in the growth apparatus was held for 5 min in a hydrogen atmosphere heated to about 1000° to clean its surface.

The first buffer layer 102 composed of BP was grown on the Si single crystal substrate 101.

The growth was conducted at 380° C. by the halide VPE method in an atmosphere of hydrogen gas using boron trichloride ($BCl_3$) and phosphorous trichloride ($PCl_3$) as source materials.

By observation using a transmission electron microscope (TEM), the inventors ascertained that the region of the grown first buffer layer 102 in the vicinity of its junction interface 101a with the substrate 101 was composed of cubic BP polycrystal and the region upward thereof was amorphous BP. The thickness of the first buffer layer 102 was approximately 20 nm and the thickness of the region composed of BP polycrystal was about 3 nm.

After growth of the first buffer layer 102 had been terminated by stopping supply of $BCl_3$ to the growth apparatus, supply of $PCl_3$ was continued for 5 min at 380° C. to make the surface of the first buffer layer 102 abundant in phosphorous.

The temperature of the substrate was then raised to 890° C. in an atmosphere of $PCl_3$ and hydrogen, whereafter an n-type second buffer layer 103 consisting of a BP single crystal layer doped with Si was grown by the halide VPE method using monosilane as the Si impurity source material. The grown second buffer layer 103 had a thickness of 2 $\mu$m and a carrier concentration of $1 \times 10^{18} cm^{-3}$. The second buffer layer was obtained as a layer with a flat and continuous surface.

Substantially no $B_{13}P_2$ polyhedral crystal was detected inside the second buffer layer 103 by ordinary x-ray diffraction analysis. SIMS analysis showed that the first and second buffer layers 102 and 103 were high-purity crystal layers with concentration of $5 \times 10^{16} cm^{-3}$ or less.

Following growth of the second buffer layer 103, the interior of the first buffer layer 102 was observed with a TEM. The amorphous portions present in the as-grown state were found to have changed to polycrystal, thereby providing a first buffer layer composed of polycrystalline BP.

Next, the second buffer layer 103 grown on the substrate was exposed to a mixed gas atmosphere of dimethylhydrazine and hydrogen for 10 min at 890° C. to nitride the surface region thereof. The portion near the surface of the second buffer layer 103 thus became a nitrogen-containing BP region composed of $BP_{0.97}N_{0.03}$. From the nitrogen atom distribution determined by SIMS analysis, the depth of the nitrided region from the surface of the second buffer layer 103 was found to be about 0.5 $\mu$m.

Group III nitride semiconductor crystal layers were grown on the second buffer layer 103 by the MOCVD method using a mixed gas atmosphere of hydrogen and argon under atmospheric pressure.

Specifically, a lower clad layer 104 composed of n-type gallium nitride (GaN) doped with Si was deposited in contact with the upper surface of the second buffer layer 103 at 890° C. using trimethylgallium (($CH_3)_3Ga$) and dimethylhydrazine as source materials. The lower clad layer 104 had a thickness of about 1.5 $\mu$m and a carrier concentration of $1.0 \times 10^{18} cm^{-3}$. As the composition at the surface of the second buffer layer 103 had been made $BP_{0.97}N_{0.03}$, the lattice constants of the second buffer layer and the lower clad layer 104 composed of GaN formed in contact with the upper surface thereof matched at the interface between the two. The crystallinity of the lower clad layer 104 was therefore excellent.

A light-emitting layer 105 composed of undoped n-type gallium.indium nitride ($Ga_{0.88}In_{0.12}N$) was grown on the lower clad layer 104 at 890° C. with trimethylindium (($CH_3)_3In$) further added as the In source material. The light-emitting layer 105 had a thickness of 0.1 $\mu$m and a carrier concentration of $2.1 \times 10^{18} cm^{-3}$. An upper clad layer 106 composed of p-type aluminum.gallium nitride ($Al_{0.10}Ga_{0.90}N$) doped with magnesium (Mg) was grown on the light-emitting layer 105 at 890° C. with trimethylgallium, trimethylaluminum (($CH_3)_3Al$) and dimethylhydrazine as source materials and cyclopentadienyl magnesium as impurity source material. The upper clad layer 106 had a thickness of 0.1 $\mu$m and a carrier concentration of $4.1 \times 10^{17} cm^{-3}$.

The cubic lower clad layer 104, light-emitting layer 105 and upper clad layer 106 composed of cubic group III nitride semiconductor crystal successively deposited on the second buffer layer 103 in the foregoing manner constituted a double heterostructure light-emitting portion having a pn junction.

A contact layer 107 composed of p-type GaN doped with Mg was grown on the upper clad layer 106. The contact layer 107 had a thickness of 0.1 $\mu$m and a carrier concenntratin of $8 \times 10^{17} cm^{-3}$.

This completed the fabrication of an epitaxial wafer usable for LED production.

After unloading from the growth apparatus, the epitaxial wafer was used to fabricate LEDs as follows.

P-type ohmic electrodes 108 (only one shown) composed of gold (Au) were formed on the contact layer 107. An n-type ohmic electrode 109 composed of an aluminum-antimony alloy was formed over the whole back-side surface of the substrate 101. As the Si single crystal substrate was conductive, the ohmic electrode 109 could be formed without partial removal of group III nitride semiconductor crystal layers.

LEDs were then obtained by separating the epitaxial wafer equipped with the electrodes into square chips measuring about 300 $\mu$m per side, utilizing the cleavage property of the Si single crystal substrate in perpendicularly intersecting [001] directions. Owing to the cleavage property of the Si single crystal substrate in the [001] crystal directions, the epitaxial wafer could be separated into chips by a simple operation. Substantially all of the fabricated chips were of good quality.

The electrical characteristics and light-emitting characteristics of the fabricated LEDs were investigated.

Under application of current of 20 mA in the forward direction, the LEDs emitted blue light with a center wavelength of about 430 nm. The half bandwidth of the emission spectrum was about 20 nm, indicating excellent monochromaticity. The LEDs were resin-molded into LED lamps. Under application of a forward current of 20 mA, the lamps exhibited excellent light emission of 1.2 cd (candela).

The forward voltage was 2.8V during passage of forward current of 20 mA and the reverse voltage was 20V during passage of reverse current of 10 $\mu$A, indicating excellent rectification property.

These excellent LED characteristics are believed to be attributable to the high quality of the group III nitride semiconductor crystal layers formed in accordance with the present invention.

EXAMPLE 2

LEDs were fabricated in the same way as in Example 1 except that the first buffer layer and the second buffer layer were formed by the MOCVD method. The fabricated LEDs had the structure shown in FIG. 1.

The fabrication steps employed were as follows.

The crystal substrate 101 and the cleaning operation prior to growth of the first buffer layer were the same as those in the Example 1.

The first buffer layer 102 and the second buffer layer 103 were grown on the Si single crystal substrate 101 by the reduced-pressure MOCVD method in a hydrogen ($H_2$) gas atmosphere using diborane ($B_2H_6$) and phosphine ($PH_3$) as source materials.

The first buffer layer 102 was first grown on the surface of the Si single crystal substrate 101 by the reduced-pressure MOCVD method at 410° C. The thickness of the first buffer layer was about 15 nm. An approximately 2 nm-thick region of the first buffer layer 102 near the junction interface 101a with the Si single crystal substrate 101 was polycrystalline in the as-grown state. The region upward thereof was amorphous. Since the first buffer layer 102 was grown using the MOCVD method, its thickness fell in the range of 15 nm±1 nm at nearly every point within the surface area of the 4-inch diameter Si single crystal substrate 101.

After growth of the first buffer layer 102, the temperature of the substrate 101 was raised to 930° C. while hydrogen gas and phosphine gas was being passed into the growth apparatus for the MOCVD method. The second buffer layer 103 was then grown on the first buffer layer 102. During growth of the second buffer layer 103, the supply ratio of $PH_3$ to $B_2H_6$ was approximately 120:1.

The second buffer layer 103 was composed of a cubic BP single crystal layer. Following growth of the second buffer layer 103, the interior of the first buffer layer 102 was observed with a TEM. The amorphous portions present in the as-grown state were found to have changed to polycrystal.

As in Example 1, the lower clad layer 104, light-emitting layer 105, upper clad layer 106 and contact layer 107 composed of cubic group III nitride semiconductor crystal were grown on the second buffer layer 103.

Also in the manner of Example 1, the p-type ohmic electrodes 108 and the n-type ohmic electrode 109 were formed on the so-fabricated epitaxial wafer. LEDs were then obtained by separating the epitaxial wafer into square chips measuring about 300 µm per side.

Under application of current of 20 mA in the forward direction, the LEDs emitted blue light with a center wavelength of about 455 nm. The half bandwidth of the emission spectrum was about 22 nm. The LEDs were resin-molded into LED lamps. Under application of a forward current of 20 mA, the lamps exhibited excellent light emission of 1 cd.

EXAMPLE 3

LEDs of the configuration shown in FIG. 2 were fabricated. The fabrication steps employed are set out in the following.

The substrate 101 used was an n-type Si single crystal doped with phosphorous (p) having a surface tilt angle of 4° off (001) toward (011).

The halide VPE method utilizing an atmosphere of hydrogen gas was conducted using boron trichloride ($BCl_3$) as boron source material and phosphorous trichloride ($PCl_3$) as phosphorous source material to grow a first buffer layer 102 on the Si single crystal substrate 101 at 550° C. and then grow a second buffer layer 103 on the first buffer layer 102 at 1050° C.

By observation of the two grown crystal layers composed solely of BP it was ascertained that the first buffer layer 102 was composed of polycrystal and had a thickness of about 1 µm. The second buffer layer 103 was composed of single crystal and had a thickness of about 1 µm.

A buffer layer 110 composed of boron phosphide containing nitrogen was grown on the second buffer layer 103 by the atmospheric-pressure MOCVD method at 800° C. The composition of BP containing nitrogen will hereinafter be represented by $BN_ZP_{1-Z}$ ($0 \leq Z \leq 1$).

The growth of the buffer layer 110 composed of BP containing nitrogen by the MOCVD method was conducted using trimethylboron (($CH_3)_3B$) as boron source material, ammonia ($NH_3$) as nitrogen source material and phosphine ($PH_3$) as phosphorous source material. The phosphine was supplied in the form of a mixed gas of 90 vol % of $H_2$ gas and 10 vol % of $PH_3$ gas.

At the initial stage of growing of the buffer layer 110 composed of BP containing nitrogen on the second buffer layer 103, the supply of ammonia gas to the growth apparatus was set to zero so that the buffer layer 110 composed of BP containing nitrogen and the two first buffer layers 102 and 103 composed solely of BP would lattice-match at the junction interface.

Since the buffer layer 110 composed of BP containing nitrogen was therefore composed solely of BP at the junction interface, the lattice constant at the junction interface matched that of the second buffer layer 103 composed solely of BP.

As growth of the buffer layer 110 composed of BP containing nitrogen progressed, the supply of ammonia gas to the growth apparatus was monotonously increased at a gradual rate to impart a gradient to the composition of the buffer layer 110 composed of BP containing nitrogen. The composition of the buffer layer 110 composed of BP containing nitrogen at the finally formed surface portion had a Z of 0.02, i.e., was $BN_{0.02}P_{0.98}$.

Growth of the buffer layer 110 composed of BP containing BP took 10 min. The thickness of the buffer layer 110 was 200 Å. Disilane ($Si_2H_6$) was concurrently supplied during growth of the buffer layer 110 to impart it with n-type conductivity by Si doping.

Next, layers 104, 105 and 106 composed of group III nitride semiconductor crystal were successively grown on the buffer layer 110 by the atmospheric-pressure MOCVD method at 740° C. Growth of the layers 104, 105 and 106 was conducted in a hydrogen atmosphere using trimethylgallium (($CH_3)_3Ga$) as gallium source material, trimethylindium (($CH_3)_3In$) as indium source material, ammonia as nitrogen source material and arsine ($AsH_3$) as arsenic source material.

First, a lower clad layer 104 composed of cubic n-type gallium nitride containing arsenic was formed on the buffer layer 110 composed of BP containing nitrogen and having a surface composition of $BN_{0.02}P_{0.98}$. The composition of the gallium nitride containing arsenic of the lower clad layer 104 was made $GaN_{0.99}As_{0.01}$. The lattice constant of $GaN_{0.99}As_{0.01}$ is 4.521 Å, which is substantially the same as the 4.520 Å lattice constant of the $BN_{0.02}P_{0.98}$ at the surface of the buffer layer 110.

Disilane was used to dope the lower clad layer 104 with Si during growth. The lower clad layer 104 was therefore of n-type. It had a carrier concentration of $3 \times 10^{18} cm^{-3}$ and a thickness of 2 µm.

A light-emitting layer 105 composed of cubic gallium.indium nitride ($Ga_{0.98}In_{0.02}N$) was grown on the lower clad layer 104. The light-emitting layer 105 was formed to a thickness of about 1000 Å. It was imparted with n-type conductivity by doping with Si and had a carrier concentration of about $5 \times 10^{17} cm^{-3}$.

An upper clad layer 106 composed of cubic p-type gallium nitride containing arsenic was grown on the light-emitting layer 105. The composition of the gallium nitride containing arsenic of the upper clad layer 106 was made $GaN_{0.99}As_{0.01}$. The upper clad layer 106 was formed to a thickness of about 5000 Å and was imparted with p-type conductivity by doping with magnesium using cyclopentadienyl magnesium as source material. It had a carrier concentration of $8 \times 10^{17} cm^{-3}$.

This completed the fabrication of an epitaxial wafer usable for LED production.

After removal from the growth apparatus, the epitaxial wafer was used to fabricate LEDs as follows.

P-type ohmic electrodes 108 (only one shown) consisting of three layers composed of AuZn alloy, Ni and Au, respectively, were formed on the upper clad layer 106. An n-type ohmic electrode 109 composed of Au was formed over the whole back-side surface of the substrate 101. LEDs were then obtained by separating the epitaxial wafer formed with the electrodes into square chips measuring about 300 μm per side, utilizing the cleavage property of the Si single crystal substrate in perpendicularly intersecting [011] directions.

The electrical characteristics and light-emitting characteristics of the fabricated LEDs were investigated.

Under application of current of 20 mA in the forward direction, the LEDs emitted light with a center wavelength of about 380 nm. The half bandwidth of the emission spectrum was about 160 Å, indicating excellent monochromaticity. The LEDs were resin-molded into LED lamps. Under application of a forward current of 20 mA, the lamps exhibited excellent light emission of 500 mcd (millicandela). The forward voltage was 4V during passage of forward current of 20 mA, indicating excellent rectification property.

These excellent LED characteristics are believed to be attributable to the high quality of the group III nitride semiconductor crystal layers formed in accordance with the present invention.

Comparative Example

LEDs were fabricated without providing the first buffer layer on the Si single crystal substrate. Instead, the same halide VPE method as in Example 1 was conducted at 890° C. to deposit an approximately 2 μm-thick buffer layer composed of BP directly on a Si single crystal substrate like that of Example 1.

However, a continuous BP buffer layer could not be formed by directly depositing BP crystal on a Si single crystal substrate at a high temperature in this manner. All that was obtained was pyramid-like islands of about 2 μm thickness scattered over the Si single crystal substrate surface.

Normal group III nitride semiconductor crystal layers usable to configure LEDs could therefore not be formed.

The method of growing group III nitride semiconductor crystal layer according to the present invention enables formation of a high-quality group III nitride semiconductor crystal layer on a Si single crystal substrate.

By use of the group III nitride semiconductor crystal layer fabricated by the growth method, moreover, there can be provided a high-performance, easy-to-fabricate LED or other semiconductor device.

What is claimed is:

1. A semiconductor device comprising:

a silicon single crystal substrate, a first buffer layer composed of polycrystalline boron phosphide provided on the substrate, a second buffer layer composed of a single crystal layer of boron phosphide provided on the first buffer layer, and a group III nitride semiconductor crystal layer provided on the second buffer layer.

2. A semiconductor device according to claim 1, wherein the second buffer layer is constituted of boron phosphide containing nitrogen at a region near an interface between the second buffer layer and the group III nitride semiconductor crystal layer provided in contact with the upper surface of the second buffer layer.

3. A semiconductor device according to claim 1, wherein the group III nitride semiconductor crystal layer provided in contact with the upper surface of the second buffer layer is composed of gallium nitride.

4. A semiconductor device according to claim 1, wherein the first buffer layer has a thickness in the range of 2 nm to 2 μm.

5. A semiconductor device comprising:

a silicon single crystal substrate, a buffer layer composed of polycrystalline boron phosphide provided on the substrate, a buffer layer composed of boron phosphide containing nitrogen provided on said buffer layer composed solely of boron phosphide, and a group III nitride semiconductor crystal layer provided on said buffer layer composed of boron phosphide containing nitrogen.

6. A light-emitting diode comprising:

a silicon single crystal substrate, a first buffer layer composed of polycrystalline boron phosphide provided on the substrate, a second buffer layer composed of a single crystal layer of boron phosphide provided on the first buffer layer, and a group III nitride semiconductor crystal layer provided on the second buffer layer.

* * * * *